United States Patent
Hyot (10) Patent No.: US 10,781,534 B2
(45) Date of Patent: Sep. 22, 2020

(54) METHOD FOR GROWING PARALLEL ELONGATE ELEMENTS (NANOWIRES, MICROWIRES) FROM A SUBSTRATE COMPRISING, FOR EACH ELONGATE ELEMENT, A SEED FORMED IN A CAVITY OF A NUCLEATION LAYER OR A NUCLEATION PAD

(71) Applicant: COMMISSARIAT A L'ENERGIE ATOMIQUE ET AUX ENERGIES ALTERNATIVES, Paris (FR)

(72) Inventor: Bérangère Hyot, Eybens (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/128,815

(22) PCT Filed: Mar. 20, 2015

(86) PCT No.: PCT/EP2015/056011
§ 371 (c)(1),
(2) Date: Sep. 23, 2016

(87) PCT Pub. No.: WO2015/144602
PCT Pub. Date: Oct. 1, 2015

(65) Prior Publication Data
US 2017/0101723 A1    Apr. 13, 2017

(30) Foreign Application Priority Data
Mar. 27, 2014    (FR) ...................................... 14 52629

(51) Int. Cl.
*H01L 33/32*    (2010.01)
*H01L 31/0304*    (2006.01)
(Continued)

(52) U.S. Cl.
CPC .......... *C30B 25/186* (2013.01); *C30B 25/005* (2013.01); *C30B 25/18* (2013.01);
(Continued)

(58) Field of Classification Search
CPC ........................................................ H01L 33/32
See application file for complete search history.

(56) References Cited

U.S. PATENT DOCUMENTS

| 2004/0048471 A1 | 3/2004 | Okagawa et al. |
| 2005/0048685 A1 | 3/2005 | Shibata |

(Continued)

FOREIGN PATENT DOCUMENTS

| EP | 1 328 014 A1 | 7/2003 |
| EP | 1 796 180 A1 | 6/2007 |

(Continued)

OTHER PUBLICATIONS

Cordier et al., "Selective area growth of GaN-based structures by molecular beam epitaxy on micrometer and nanometer size patterns", Materials Science in Semiconductor Processing, vol. 12, No. 1-2, 2009, pp. 16-20; cited in the ISR.
(Continued)

*Primary Examiner* — Moazzam Hossain
(74) *Attorney, Agent, or Firm* — Seckel IP, PLLC (57) ABSTRACT

The method for growing an elongate element (5), notably a wire of nanowire or microwire type, includes forming a nucleation surface (3) having at least one germination site adopting the form of a germination hollow (7) and delimited at least partly by a mask (2), the at least one germination hollow (7) being situated at a distance from the mask (2), performing nucleation of a seed (4) intended to participate in the growth of the elongate element (5) on the at least one germination hollow (7), and growing the elongate element (5) from the seed (4).

18 Claims, 8 Drawing Sheets

(51) Int. Cl.
  *C30B 25/18* (2006.01)
  *C30B 29/40* (2006.01)
  *C30B 29/62* (2006.01)
  *C30B 25/00* (2006.01)

(52) U.S. Cl.
  CPC ............ *C30B 29/40* (2013.01); *C30B 29/403* (2013.01); *C30B 29/406* (2013.01); *C30B 29/62* (2013.01); *H01L 31/03044* (2013.01); *H01L 33/32* (2013.01)

(56) References Cited

U.S. PATENT DOCUMENTS

| | | |
|---|---|---|
| 2007/0248132 A1 | 10/2007 | Kikuchi et al. |
| 2009/0174038 A1 | 7/2009 | Wang |
| 2009/0243043 A1 | 10/2009 | Wang |
| 2009/0315120 A1* | 12/2009 | Shifren ............. H01L 29/66628 257/386 |
| 2010/0193910 A1 | 8/2010 | Kishino et al. |
| 2010/0308474 A1* | 12/2010 | Shibuya ................ H01L 21/486 257/778 |
| 2011/0186804 A1* | 8/2011 | Khayyat ................. H01L 21/20 257/9 |
| 2011/0257040 A1* | 10/2011 | Turner ................. B01J 19/0046 506/16 |
| 2014/0217610 A1* | 8/2014 | Jeng .................... H01L 23/3128 257/774 |
| 2014/0285224 A1* | 9/2014 | Albuschies ............ B82Y 40/00 324/691 |
| 2014/0363912 A1* | 12/2014 | Ohlsson ............. H01L 33/0062 438/35 |
| 2015/0014631 A1* | 1/2015 | Ohlsson ............. H01L 21/0237 257/24 |
| 2015/0102502 A1* | 4/2015 | Chiu .................... H01L 21/561 257/774 |
| 2015/0200231 A1* | 7/2015 | Herget ................... H01F 7/021 257/421 |
| 2015/0206796 A1* | 7/2015 | Dasgupta .......... H01L 21/02381 257/76 |
| 2018/0012830 A1* | 1/2018 | Chen ....................... H01L 24/11 |

FOREIGN PATENT DOCUMENTS

| | | |
|---|---|---|
| EP | 2 202 329 A1 | 6/2010 |
| GB | 2 436 398 A | 9/2007 |
| WO | 2008/087452 A1 | 7/2008 |
| WO | 2013/121289 A2 | 8/2013 |
| WO | 2013/121289 A3 | 12/2013 |

OTHER PUBLICATIONS

Bertness et al., "Controlled Nucleation of GaN Nanowires Grown with Molecular Beam Epitaxy", Advanced Functional Materials, vol. 20, No. 17, 2010, pp. 2911-2915; cited in the ISR.

Seo et al., "Catalytic nanocapillary condendation and epitaxial GaN nanorod growth", Physical Review B, vol. 71, 2005, pp. 235314-1 to 23514-5; cited in the ISR.

Schumann et al., "Selective-area catalyst-free MBE growth of GaN nanowires using a patterned oxide layer"Nanotechnology, vol. 22, No. 9, 2011, p. 95603 (6 pages); cited in the ISR.

Wang et al., "Lateral epitaxial overgrowth of GaN on a patterned GaN-on-silicon substrate by molecular beam epitaxy", Semiconductor Science and Technology, vol. 26, No. 4, 2011, p. 45015 (6 pages); cited in the ISR.

Li et al., "GaN based nanorods for solid state lighting", Journal of Applied Physics, vol. 111, No. 7, 2012, pp. 071101-1 to 071101-23; cited in the ISR.

Cherns et al., "Defect reduction in GaN(0001) sapphire films grown by molecular beam epitaxy using nanocolumn intermediate layers", Applied Physics Letters, vol. 92, No. 12, 2008, pp. 121902-1 to 121902-3; cited in the ISR.

Bergbauer et al., "Continuous-flux MOVPE growth of position-controlled N-face GaN nanorods and embedded InGaN quantum wells", Nanotechnology, vol. 21, No. 30, 2010, p. 305201 (5 pages); cited in the ISR.

Parijat et al., "Faceted and Vertically Aligned GaN Nanorod Arrays Fabricated without Catalysts or Lithography", Nano Letters, vol. 5, No. 9, 2005, pp. 1847-1851; cited in the ISR.

International Search Report and Written Opinion dated Jul. 5, 2015 issued in corresponding application No. PCT/JP2015/056011; w/ English partial translation and partial machine translation (35 pages).

European Office Action dated Nov. 21, 2018 in counterpart European application No. EP 15711194.9 (with English machine translation; 9 pages).

Schumann et al., "Cathodoluminescence spectroscopy on selectively grown GaN nanowires", Gallium Nitride Materials and Devices VI, vol. 7939, No. 1, pp. 1-9, SPIE, Bellingham, Washington, USA, Feb. 10, 2011 (cited in the EP Office Action; in English; 9 pages).

* cited by examiner

METHOD FOR GROWING PARALLEL ELONGATE ELEMENTS (NANOWIRES, MICROWIRES) FROM A SUBSTRATE COMPRISING, FOR EACH ELONGATE ELEMENT, A SEED FORMED IN A CAVITY OF A NUCLEATION LAYER OR A NUCLEATION PAD

TECHNICAL FIELD OF THE INVENTION

The invention relates to the growth of an elongate element, notably of microwire or nanowire type, in the field of electronics, in particular of optoelectronics.

The subject of the invention is, more particularly, a method for growing an elongate element, notably a wire of nanowire or microwire type.

STATE OF THE ART

The high cost per lumen of the current planar light-emitting diodes, notably white, is urging the development of new breakthrough solutions. In order to reduce this cost, one possibility is, on the one hand, to use a substrate, notably of silicon, and, on the other hand, to produce light-emitting diode structures based on microwires/nanowires to avoid the critical step of the planar growth, for example, of GaN on Si.

However, the controlled growth of perfectly vertical microwires is essential to the optimal performance of all the subsequent technological steps necessary for the fabrication of the component.

It is known practice to use a nucleation layer on which a mask is formed. The mask comprises a plurality of openings each making it possible to delimit a microwire growth site. However, it is observed, after growth of the microwires, that a certain number thereof are not vertical. This causes problems for performing the subsequent steps of functionalization of the microwires.

Thus, there is a resulting need to increase the probability of formation of a vertical elongate element, and, ideally, to make it possible to ensure that the latter is definitely vertical.

OBJECT OF THE INVENTION

The aim of the present invention is to propose a solution which wholly or partly remedies the drawbacks listed above.

This aim is targeted notably by the use of a method for growing an elongate element, notably a wire of nanowire or microwire type, which comprises the following steps:
 a formation of a nucleation surface having at least one germination site adopting the form of a germination hollow and delimited at least partly by a mask, said at least one germination hollow being situated at a distance from the mask,
 a nucleation of a seed intended to participate in the growth of said elongate element on said at least one germination hollow,
 a growth of said elongate element from said seed.

According to one implementation, the step of formation of the nucleation surface comprises a step of formation of the mask on a nucleation layer, an opening of said mask forming, with a part of the nucleation layer, a blind hole of which the bottom formed by said part of the nucleation layer corresponds to the nucleation surface. Preferably, the following steps are performed in succession: a modification of the topology of the nucleation layer so as to form said at least one germination hollow, the step of formation of the mask, the step of nucleation of the seed, the step of growth of the elongate element.

According to another implementation, the method comprises a step of supply of a substrate on which is formed a nucleation layer, and the step of formation of the nucleation surface comprises the following steps:
 an etching of the nucleation layer to the substrate so as to form a block,
 a formation of the mask on the substrate, said mask surrounding said block, notably at its base arranged at the corner of said block with the substrate.

Preferably, according to this other implementation, the method comprises the following steps in succession: a modification of the topology of the nucleation layer so as to form said at least one germination hollow, the etching of the nucleation layer, the formation of the mask, the step of nucleation of the seed, the step of growth of the elongate element.

Advantageously, the method comprises a step of formation of said at least one germination hollow performed such that said at least one germination hollow defines a seed nucleation zone exhibiting a variation of energy necessary for the formation of said seed, in the only nucleation zone, less than the variation of energy necessary for the formation of a same seed at the corner between the mask and the nucleation surface.

According to a refinement, the step of formation of the nucleation surface is such that it comprises a step of determination of the form of said at least one germination hollow taking into account a first wettability factor of the material intended to form the seed on the material used to form the nucleation surface and a second wettability factor of the material intended to form the seed on the material used to form the mask, and a step of formation of said at least one germination hollow according to the determined form.

For example, the germination hollow adopts, notably wholly or partly, the form of a cone, notably of revolution or pyramidal, the surface of which is defined by a generating straight line passing through a fixed point belonging to a main axis that is secant, notably at right angles, to the plane including a directing curve of said cone, and the method comprises a step of determination of an angle α/2, notably maximum, between the generating straight line and said main axis, said angle α/2 being determined from the first and second wettability factors.

In particular, the step of determination of the angle α/2 can comprise the solving of the following equation $$\Delta E^{III} - \Delta E^{I} = cte2 * \left[ -\frac{1}{2}(f1 - f2)\sin\frac{\alpha}{2} + 2 * \left(1 - \cos\frac{\alpha}{2} - \frac{1}{2}\sin\frac{\alpha}{2}\right) \right]$$

for which the result $\Delta E^{III} - \Delta E^{I}$ must be less than or equal to 0, with cte2 greater than 0, f1 the first wettability factor such that $0 \leq f1 \leq 1$, f2 the second wettability factor such that $-1 \leq f2 \leq 0$.

Preferentially, the step of formation of the nucleation surface is such that said at least one germination hollow adopts, notably wholly or partly, the form of a cone, notably of revolution or pyramidal, the surface of which is defined by a generating straight line passing through a fixed point belonging to a main axis that is secant, notably at right angles, to the plane including a directing curve of said cone, the maximum angle α/2 between the generating straight line and the main axis being less than 53 degrees.

The invention also relates to a method for fabricating an electronic device, notably optoelectronic, which comprises a step of implementation of the method for growing an elongate element as described, and a step of functionalization of said elongate element such that the latter participates in the emission, or in the reception, of photons.

The invention also relates to a substrate functionalized for the growth of an elongate element, notably a wire of nanowire or microwire type, said substrate comprising a nucleation surface making it possible to grow the elongate element, a mask at least partly delimiting said nucleation surface, said nucleation surface comprising at least one germination hollow situated at a distance from the mask.

In the context of the functionalized substrate, said at least one germination hollow adopts the form of a cone, notably of revolution or pyramidal, of which all or part of the surface is defined by a generating straight line passing through a fixed point belonging to a main axis that is secant, notably at right angles, to the plane including a directing curve of said cone, the maximum angle α/2 between the generating straight line (d1) and the main axis being less than 53 degrees.

The invention also relates to an electronic device, notably optoelectronic, comprising an elongate element extending from a nucleation surface, said at least one germination hollow belonging to the nucleation surface is filled with material of the elongate element.

Preferably, the device comprises a photon emitting or receiving member, said member comprising a P-N junction of which a part is formed by said elongate element.

BRIEF DESCRIPTION OF THE DRAWINGS

Other advantages and features will emerge more clearly from the following description of particular embodiments of the invention given as nonlimiting examples and represented in the attached drawings, in which.

DESCRIPTION OF PREFERENTIAL EMBODIMENTS OF THE INVENTION

The present invention differs from what has been described in the prior art in that it is proposed to control the surface topology of the nucleation layer (layer which will allow the growth of the wires, notably of GaN) in order to control the phenomenon of germination of the GaN and improve the verticality of said wires.

Figure 1:
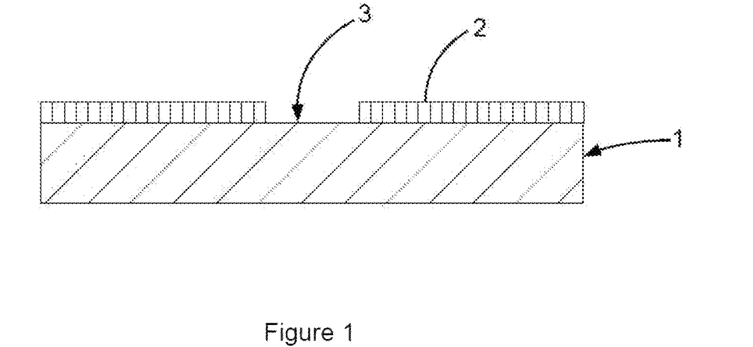
FIGS. 1 to 3 are cross-sectional views of different steps of growth of a microwire according to the prior art.

As illustrated in FIG. 1, tests have demonstrated that, by using a substrate 1 on which a mask 2 is formed so as to allow free access to a nucleation surface 3 derived from the substrate 1, it was possible to observe that the issue of non-verticality of the wires stemmed from a phenomenon occurring in the first instants of the phase of germination of a wire, for example in GaN, on a silicon substrate (formed at least partly by the substrate 1).

Figure 2:
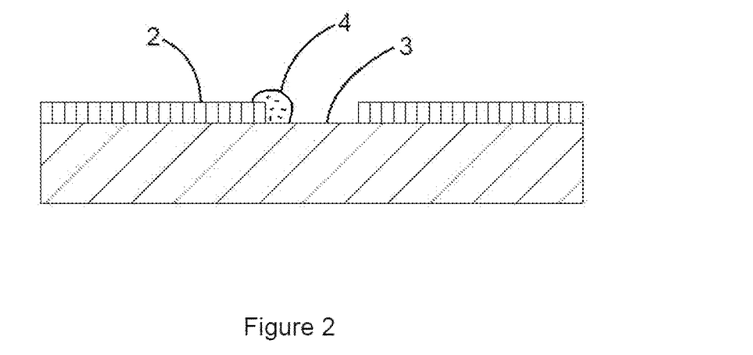
Figure 3:
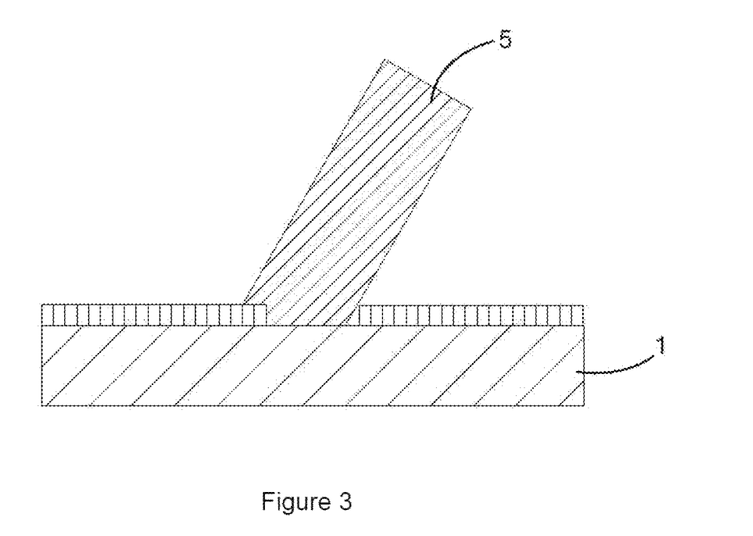

In fact, as illustrated by FIG. 2, the seed 4 tends to be formed at the corner between the mask 2 and the nucleation surface 3. Consequently, the seed is not centered on the nucleation surface and it is this behavior which generates a non-vertical growth of wire 5 relative to the substrate 1 (FIG. 3).

Along this line, it has emerged that by modifying the topology of the nucleation surface, notably by forming therein a preferentially adapted germination hollow, the seed would have a greater tendency to form in the germination hollow and not at the corner between the mask 2 and the nucleation surface 3. To avoid the non-vertical growth, this germination hollow is formed at a distance from the mask 2.

In the above explanation, reference is made to a wire. However, it is possible to expand this concept of wire to any elongate element. In particular, the elongate element can be a wire, for example of nanowire or microwire type.

The term "microwire" or "nanowire" hereinbelow in the description preferentially means a three-dimensional structure of elongate form of which the longitudinal dimension is at least greater than one times the transverse dimension or dimensions, preferably at least five times and even more preferentially at least ten times. The transverse dimension or dimensions lie between 5 nm and 2.5 µm. In some embodiments, the transverse dimensions can be less than or equal to approximately 1 µm, preferably lie between 100 nm and 300 nm. In some embodiments, the height of each nanowire, or microwire, can be greater than or equal to 500 nm, preferably between 1 µm and 50 µm.

Figure 4:
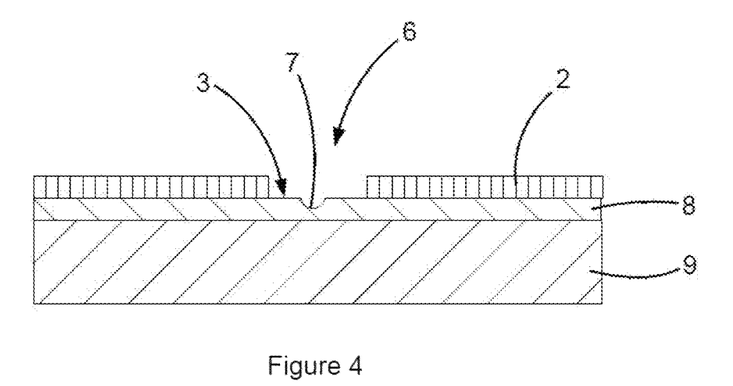
FIGS. 4 to 6 are cross-sectional views of different steps of growth of an elongate element according to a particular embodiment of the invention.
Figure 5:
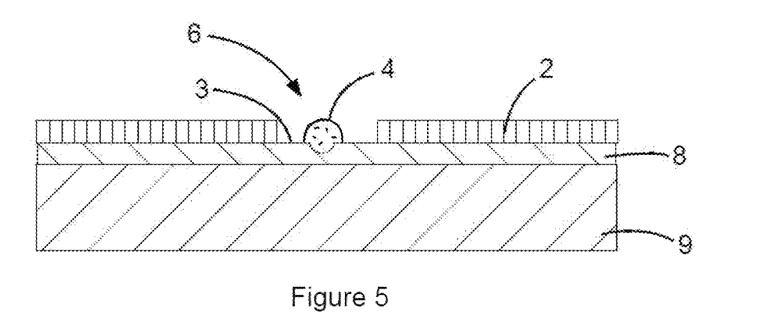
Figure 6:
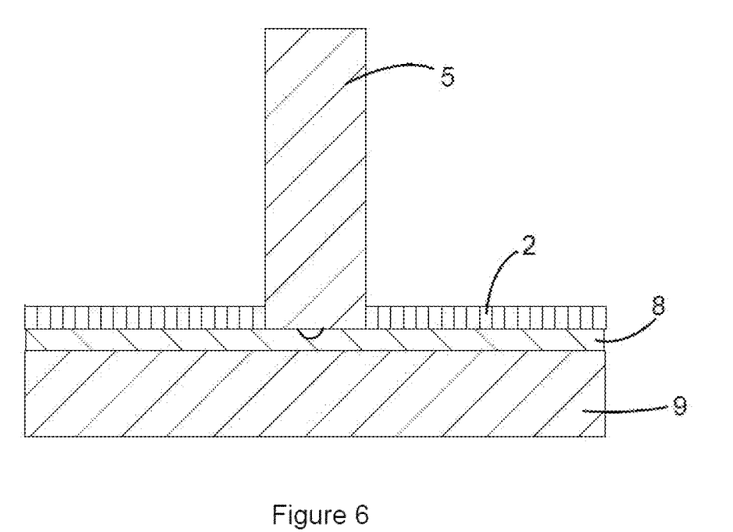
Figure 7:
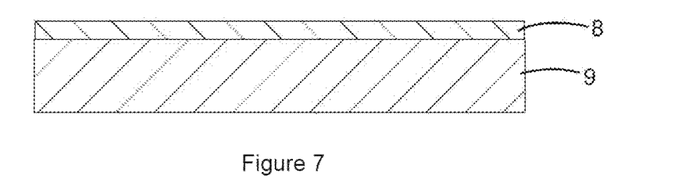
FIGS. 7 to 11 are cross-sectional views of different steps of growth of an elongate element according to another embodiment of the invention, FIG. 12 schematically represents the formation of a crystalline seed in the form of a spherical dome.
Figure 8:
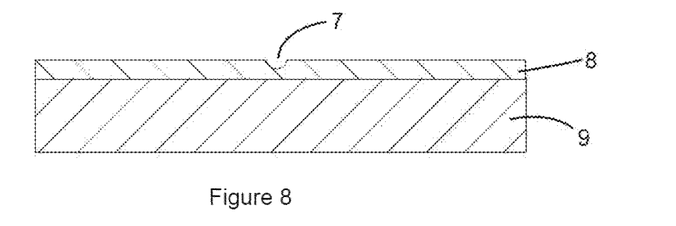
Figure 9:
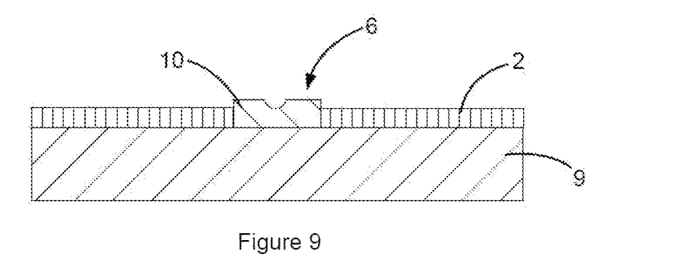
Figure 10:
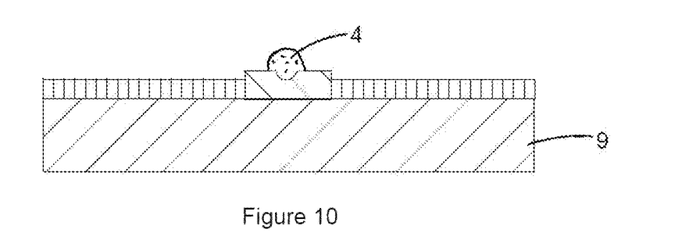

In this sense, as illustrated in FIGS. 4 to 6, the method for growing an elongate element 5, notably a wire, for example of nanowire or microwire type, comprises a step of formation of a nucleation surface 3 (notably thus forming a preferred zone 6 of growth of said elongate element 5) having at least one germination site adopting the form of a germination hollow 7. The nucleation surface 3 is delimited at least partly by a mask 2. Said at least one germination hollow 7 is situated at a distance from the mask 2. Furthermore, the growth method comprises a nucleation step, also referred to in the field as germination step (it will then be understood that, in the present description, the terms nucleation and germination have the same meaning), (FIG. 5) of a seed 4 intended to participate in the growth of said elongate element 5 (in case of presence of several germination hollows 7, one seed 4 can be nucleated in each germination hollow 7 during the nucleation step) on said at least one germination hollow 7 of the nucleation surface 3. Finally, the method comprises a step of growth of said elongate element 5 from the seed 4.

The expression "germination hollow situated at a distance from the mask" should be understood to mean that the germination hollow 7 is not situated at the corner between the mask 2 and the nucleation surface 3 but at a certain distance from said mask 2. A "certain distance" should be understood to mean that the germination hollow 7 is situated at a distance from the mask 2 at least equal to one times, two times, five times or ten times the width of the germination hollow 7. Preferentially, the germination hollow 7 is situated substantially at the center of the nucleation surface 3 of which the periphery is delimited by the mask 2.

"Nucleation surface" should be understood to mean at least a part of an outer surface of an element such as a block, or a layer, formed in a material compatible with the formation of a seed 4 in order to allow the growth of the elongate element 5.

The growth step is preferentially such that the elongate element extends, along its direction of elongation, from said nucleation surface 3 while moving away from said nucleation surface 3.

According to a first implementation (FIGS. 4 to 6), the step of formation of the nucleation surface 3 comprises a step of formation of the mask 2 on a nucleation layer 8, an opening of said mask 2 forming, with a part of the nucleation layer 8, a blind hole of which the bottom formed by said part of the nucleation layer 8 corresponds to the nucleation surface 3 delimited by the mask 2.

Preferentially, in the context of this first implementation, the following steps are performed in succession: a modification of the topology of the nucleation layer 8 so as to form said at least one germination hollow 7, the step of formation of the mask 2, the step of nucleation of the seed 4, the step of growth of the elongate element 5.

According to a second implementation illustrated in FIGS. 7 to 11, the method comprises a step of supply of a substrate 9 on which is formed a nucleation layer 8 (FIG. 7), and the step of formation of the nucleation surface 3 comprises the following steps: an etching of the nucleation layer 8 to the substrate 9 so as to form a block 10 (FIG. 9); a formation of the mask 2 on the substrate 9, said mask 2 surrounding said block 10, notably at its base arranged at the corner of said block 10 with the substrate 9. The block 10 can form a protuberance relative to the mask 2, but, preferentially, the block 10 is flush with the mask 2.

Alternatively, the substrate supplied can also directly comprise the block 10 (obtained in any way).

Figure 11:
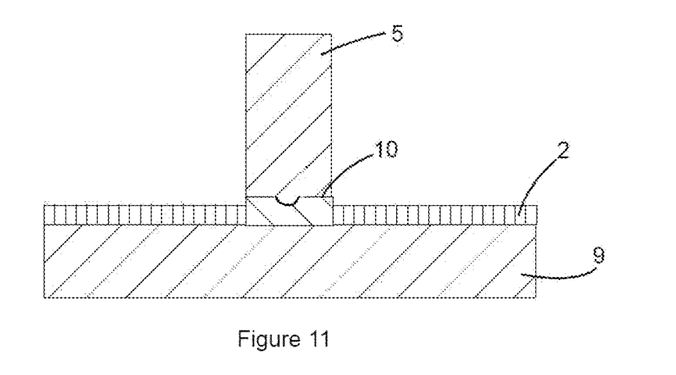

Preferentially, in the context of this second implementation, the method comprises the following steps in succession: a modification of the topology of the nucleation layer 8 (FIG. 8) so as to form said at least one germination hollow 7, the etching of the nucleation layer 8, the formation of the mask 2 (FIG. 9), the step of nucleation of the seed 4 (FIG. 10), the step of growth of the elongate element 5 (FIG. 11).

In a way applicable to the first and second implementations, the nucleation layer can comprise, or consist of, aluminum nitride, or a nitride of a transition metal, for example chosen from TaN, ZrN, HfN, NbN, etc., the thickness of which can lie between 10 nm and 100 nm. Preferentially, this nucleation layer 8 (for example prepared ex-situ) can be formed in two steps: first of all the metal (Ta, Zr, Hf, Nb, etc.) is deposited on the substrate 9 (substrate visible in FIGS. 4 to 11), then, after this deposition, a step of nitriding under NH3 of the layer of deposited metal is performed to obtain the compound MxNy (with M being the metal chosen and N the nitride, x and y representing the stoichiometries of the nitrided transition metal).

Preferentially, the substrate 9 is of n-doped silicon, notably n+ doped. It makes it possible, for example, to inject charge carriers via the silicon substrate into the active part of the device which will be located at the elongate element 5. The n+ doped substrates have a very low electrical resistance, of the order of a few mΩ·cm.

Preferentially, the step of modification of the topology of the nucleation layer 8 so as to form said at least one germination hollow 7 is performed by indentation. "Indentation" should be understood to mean that the step implements the use of a point whose end is shaped so as to partially penetrate the nucleation layer 8 so that, after the point is removed, the germination hollow 7 obtained has a predetermined form.

According to one embodiment, the method comprises, generally and in a manner applicable to all its embodiments, a step of modification of the topology of the nucleation layer, notably performed as described above, to form said at least one germination hollow. In particular, this step of modification of the topology of the nucleation layer is performed after formation of said nucleation layer. In this respect, it can be defined that the modification of the topology of the nucleation layer consists in forming a germination hollow, the properties of which make it possible for the seed to be formed automatically in said corresponding germination hollow. Notably, the step of modification of the topology is such that the germination hollow is of a depth approximating to the thickness of the nucleation layer but without exceeding it. According to a nonlimiting example, the thickness of the nucleation layer is of the order of 20 nm and the depth of the germination hollow lies between 5 nm and the thickness of the nucleation layer minus 1 nm. In other words, in this case, the germination hollow is not comparable to a simple surface roughness and can be such that it comprises a bottom delimited by a part of the nucleation layer.

Preferentially, the seed 4 nucleated in the nucleation step is of gallium nitride.

Advantageously, the step of nucleation of the seed 4 is performed according to the MOCVD technique, MOCVD being the acronym for "Metalorganic chemical vapor deposition".

Moreover, the elongate element 5 obtained at the end of the growth step can be of gallium nitride, preferentially n doped. The growth is perhaps performed according to the MOCVD technique.

In the context of the first implementation, the mask 2 can be deposited on the nucleation layer 8. The deposition can be random (for example in situ using $Si_xN_y$ for example) or organized (for example $Si_3N_4$, $SiO_2$, etc.).

In the context of the second implementation, after etching of the nucleation layer 8, the substrate 9, preferentially of silicon, exhibits zones revealed where the etching has been performed. These revealed zones delimit the block or blocks 10. In this case, it is possible to form the mask 2 by implementation of a step of nitriding under NH3 of the revealed zones of the substrate of silicon (the mask is then of $Si_xN_y$).

It will be understood from what has been stated above that the presence of the germination hollow 7 makes it possible to promote the vertical growth of an elongate element relative to the plane in which the mask or the substrate 9 is formed.

"Vertical growth of the elongate element 5" should be understood to mean that the latter has two opposing longitudinal ends of which one is in contact with the nucleation layer 3 and the other is at a distance from said nucleation layer 3, the direction of elongation being substantially at right angles to the plane including the nucleation surface 3 and/or to a plane including the substrate 9.

By adapting the form of the germination hollow 7, it is also possible to increase the probabilities of nucleation of the seed 4 at said germination hollow 7.

Figure 12:
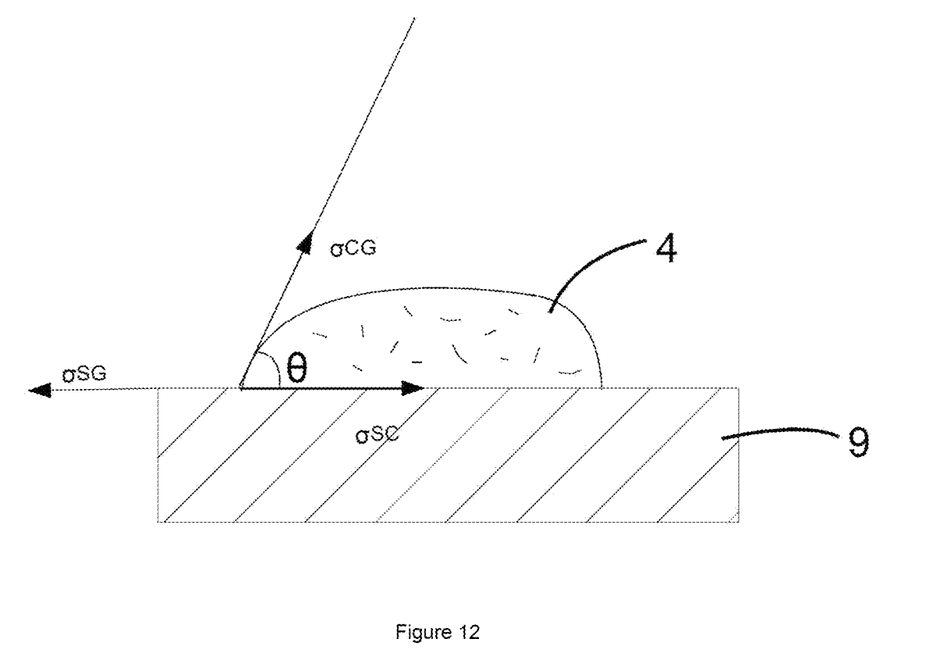

According to a particular example, the phenomenon of nucleation of a seed of gallium nitride on a substrate, notably by the MOCVD technique, can be understood by a purely thermodynamic approach involving an energy budget of the surfaces and interfaces. The heterogeneous germination of GaN on a substrate 9 can be schematically represented by a crystalline embryo (corresponding to the seed 4 described above), the form of which is that of a spherical dome formed on a planar substrate as is represented in FIG. 12. $\sigma_{CG}$ designates the interfacial tension for the crystal-gas surface, $\sigma_{SG}$ the interfacial tension for the substrate-gas surface and $\sigma_{SC}$ the substrate-crystal interface energy. The interface energies are linked by the Young-Dupré relationship:

$$\sigma_{SG} = \sigma_{CG} \cos \theta + \sigma_{SC}$$

where θ is the angle of contact of the embryo/seed 4 on the substrate 9.

In the example which is given hereinbelow, θ corresponds to $\theta_{GaN/CN}$.

Figure 13:
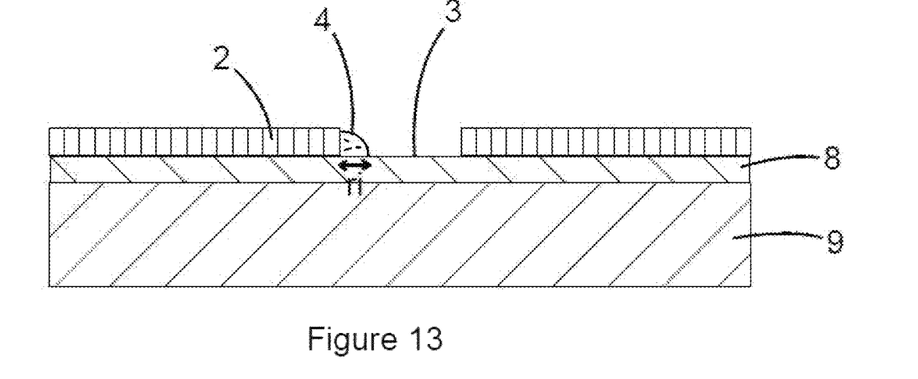
FIGS. 13 and 14 illustrate two variants of nucleation of a seed.
Figure 14:
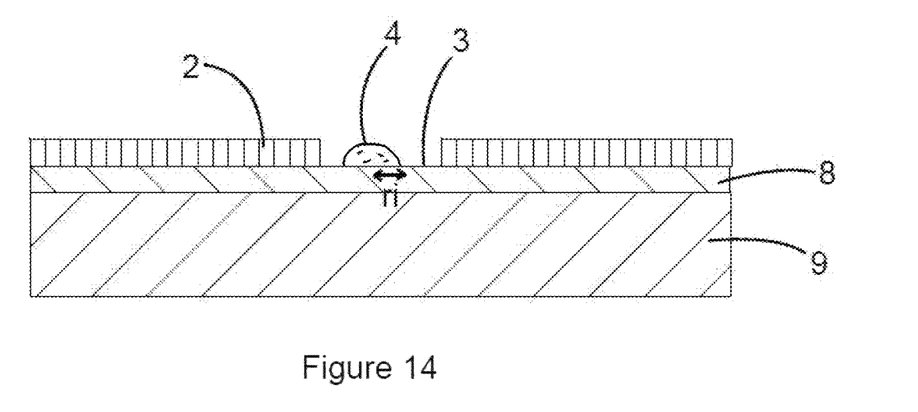

FIGS. 13 and 14 each illustrate a nucleation layer 8 preferentially borne by a substrate 9 and on which a mask 2 is formed. In FIG. 13, the seed 4 is formed at the corner between the nucleation layer 8 (on the nucleation surface 3) and the mask 2, and in FIG. 14 the seed 4 is formed at the center of the nucleation surface 3 (here without any germination hollow 7 according to the invention). By applying the model described above to the geometries of FIGS. 13 and 14, it is possible to access the energy variation $\Delta E^I$ associated with the formation of a seed of GaN when the latter is located at the corner between the mask and the nucleation layer (FIG. 13) and with that $\Delta E^{II}$ associated with the germination of a crystal of GaN when the latter stands only on the nucleation layer 8 (FIG. 14). The difference between these two energy variations can be expressed according to the following expression:

$$\Delta E^I - \Delta E^{II} = cte(f1 - f2 - 2)$$

Where cte is a positive constant, f1 represents the wettability factor of the gallium nitride on the nucleation layer 8 ($Ta_xN_y$ in the case of the example) with $0 \leq f1 \leq 1$, and f2 the wettability factor of GaN on the mask 2 ($Si_xN_y$ in the case of the example) with $-1 \leq f2 \leq 0$.

In the above equation, cte is a constant and positive prefactor which includes a reference distance $r_i$.

Notably, there is $$cte = \frac{\pi r i^2}{2} \sigma_{GaN}$$

where ri is the radius of the seed (notably visible in FIGS. 13 and 14) and $\sigma_{GaN}$ the surface energy of the GaN when the seed is of GaN. Obviously, a person skilled in the art can adapt the formula to obtain cte when the seed is of a material other than GaN, the equation can then be written by replacing $\sigma_{GaN}$ with $\sigma_M$ where $\sigma_M$ represents the surface energy of the material M forming the seed.

Furthermore, for solving purposes, the sign of $\Delta E^I - \Delta E^{II}$ needs to be known, and in this case, cte is a positive constant and the terms between parentheses above therefore need to be known.

By taking f1=cos $\theta_{GaN/CN}$ where $\theta_{GaN/CN}$ is the contact angle of the embryo (the seed 4) of GaN on the nucleation layer. It is assumed that there is a strong interaction between GaN and the nucleation layer, that is to say that $0° \leq \theta_{GaN/CN} \leq 90°$. For example, when $\theta_{GaN/CN} = 0°$ (f1=1), there is total wetting of GaN on the nucleation layer.

By taking f2=cos $\theta_{GaN/SixNy}$ where $\theta_{GaN/SiNx}$ is the contact angle of the embryo (the seed 4) of GaN on the mask 2 ($Si_xN_y$). It is assumed that there is a weak interaction between GaN and $Si_xN_y$, that is to say that $90° \leq \theta_{GaN/SixNy} \leq 180°$. When $\theta_{GaN/SixNy} = 180°$ (f2=−1), there is total dewetting of GaN on the mask.

The values of the parameters f1 and f2 can be estimated by drop angle measurements.

It emerges that whatever the value of f1 and f2, the difference $\Delta E^I - \Delta E^{II}$ is always negative, which means that the germination of GaN on an "edge of the mask" (FIG. 13) is, in energy terms, more probable than that occurring directly on the nucleation layer (FIG. 14).

In other words, beyond the simple germination hollow 7 of any form, it is preferable for the method to comprise a step of formation of said at least one germination hollow 7 performed such that said at least one germination hollow 7 defines a seed 4 nucleation zone exhibiting a variation of energy necessary for the formation of said seed, in the only nucleation zone, less than the energy variation necessary for the formation of a same seed at the corner between the mask 2 and the nucleation surface 3.

In particular, it will be understood that the step of formation of the nucleation surface 3 can be such that it comprises a step of determination of the form of said at least one germination hollow 7 taking into account a first wettability factor f1 of the material intended to form the seed 4 on the material used to form the nucleation surface 3 and a second wettability factor f2 of the material intended to form the seed 4 on the material used to form the mask 2, and a step of formation of said at least one germination hollow 7 according to the determined form.

Figure 15:
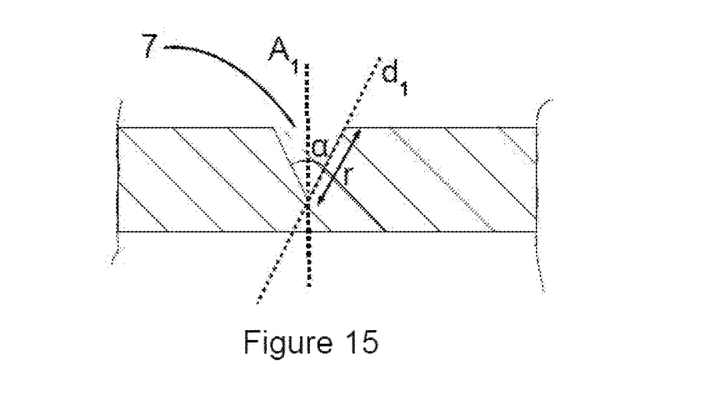
FIG. 15 illustrates in more detail the form of a germination hollow formed on the nucleation surface.

Preferentially, said at least one germination hollow 7 has a generally cone of revolution form, the method comprises a step of determination of an angle α/2, notably maximum, of the generating straight line d1 of the cone relative to the axis of rotation A1 of said generating straight line d1 from the first and second wettability factors f1, f2. Thus, as illustrated in FIG. 15, the germination hollow 7 can be characterized by an angle α representing in fact two times the angle of the generating straight line d1 of the cone typically defined by the angle between the generating straight line d1 and the axis of rotation A1 of the generating straight line d1. "Maximum angle α/2" should be understood to mean that the germination hollow 7 will preferentially be shaped such that the angle of the generating straight line d1 of the cone relative to the axis of rotation A1 of said generating straight line d1 is less than α/2. Obviously, because of the presence of the germination hollow 7, α/2 is strictly greater than 0. For example, α/2 is greater than 5° or 10°.

A germination hollow 7 has been described above that is of generally cone of revolution form, but this example is not limiting in as much as the germination hollow 7 can also have a pyramidal cone form.

By definition, a cone exhibits a set surface defined by a generating straight line passing through a fixed point called vertex and a variable point describing a closed planar curve called directing curve. This directing curve can adopt the form of a circle (cone of revolution) of a square (pyramidal cone), any form, etc.

In this respect, everything stated in the present description for a cone of revolution can be applied to these other forms, and more generally, the germination hollow 7 can adopt, notably wholly or partly, the form of a cone, notably of revolution or pyramidal, of which the surface is defined by a generating straight line passing through a fixed point belonging to a main axis that is secant, notably at right angles, to the plane including a directing curve of said cone. In particular, the method comprises a step of determination of an angle α/2, notably maximum, between the generating straight line (d1) and said main axis, said angle α/2 being determined from the first and second wettability factors f1, f2.

Thus, by considering a structuring (that is to say a hollow) of the nucleation layer of which the morphology can be characterized by a reference distance r and an angle α (FIG. 15), it is possible, as in the preceding cases, to evaluate the energy variation $\Delta E^{III}$ associated with the germination of the GaN on this "hollow", or more generally associated with the nucleation of a seed 4 on the germination hollow 7 (for the evaluation of the surfaces, 3D objects are considered, that is to say objects involving surfaces of a cone and of a spherical dome).

The reference distance r is set as an arbitrary variable. In practice r can be of the order of a few nanometers to a few tens of nanometers.

Figure 16:
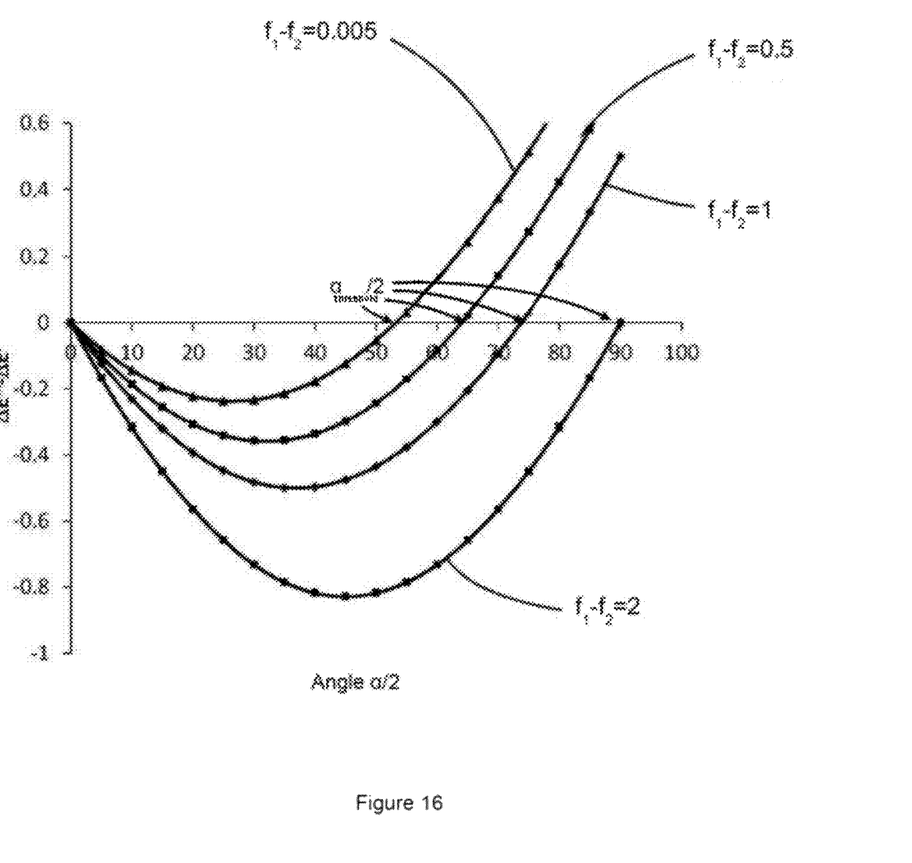
FIGS. 16 and 17 illustrate the variation of $\Delta E^{III} - \Delta E^I$ as a function of the angle α/2.

The difference between this energy variation $\Delta E^{III}$ and that associated with the formation of a seed of GaN when the latter is located at the corner between the mask and the nucleation layer ($\Delta E^I$ as defined above) makes it possible to access the values of the angle α for which the difference $\Delta E^{III} - \Delta E^I$ is negative, in other words for which angles of the germination hollow 7 it becomes more probable from an energy budget viewpoint to promote the germination of GaN directly on the structured nucleation layer rather than on the edge of the mask. The graph of FIG. 16 shows the trend of $\Delta E^{III} - \Delta E^I$ as a function of the angle α/2 (that is to say the angle between the generating straight line d1 of the cone of revolution and the axis of rotation A1 of the straight line d1) for different values of the expression f1−f2. It is therefore seen that, in the case where f1 and f2 are known, the equation:

$$\Delta E^{III} - \Delta E^I = cte2 * \left[ -\frac{1}{2}(f1 - f2)\sin\frac{\alpha}{2} + 2 * \left(1 - \cos\frac{\alpha}{2} - \frac{1}{2}\sin\frac{\alpha}{2}\right) \right]$$

gives access to a threshold value $\alpha_{threshold}$ of the angle α. Below $\alpha_{threshold}$, $\Delta E^{III} - \Delta E^I \leq 0$ and the nucleation of the seed of GaN is promoted on the structured nucleation layer. (Note: the value of the angle $\alpha_{threshold}$ for which $\Delta E^{III} - \Delta E^I \leq 0$ is independent of the surface energy of GaN).

In other words, the step of determination of the angle α/2, notably between the generating straight line d1 of the cone and the axis of rotation A1 of said generating straight line d1, comprises the solving of the following equation $$\Delta E^{III} - \Delta E^I = cte2 * \left[ -\frac{1}{2}(f1 - f2)\sin\frac{\alpha}{2} + 2 * \left(1 - \cos\frac{\alpha}{2} - \frac{1}{2}\sin\frac{\alpha}{2}\right) \right]$$

for which the result $\Delta E^{III} - \Delta E^I$ must be less than or equal to 0, with cte2 greater than 0, f1 the first wettability factor such that 0≤f1≤1, and f2 the second wettability factor such that −1≤f2≤0.

Thus, it will be understood that the solving of the equation $$\Delta E^{III} - \Delta E^I = cte2 * \left[ -\frac{1}{2}(f1 - f2)\sin\frac{\alpha}{2} + 2 * \left(1 - \cos\frac{\alpha}{2} - \frac{1}{2}\sin\frac{\alpha}{2}\right) \right]$$

will give a value of the angle α and that it will preferentially be necessary to remain below if the aim is to best promote the nucleation of the seed in the germination hollow 7.

In the above equations, cte2 is a constant and positive prefactor which preferentially includes the value of the reference distance r. More particularly, there is cte2=$\pi r^2 \sigma_{GaN}$ where r is the radius of the seed and $\sigma_{GaN}$ the surface energy of the GaN when the seed is of GaN. Obviously, a person skilled in the art can adapt the formula to obtain cte2 when the seed is of a material other than GaN, the equation can then be written cte2=$\pi r^2 \sigma_M$ where $\sigma_M$ represents the surface energy of the material M forming the seed. Here, there is a link between the distance r of FIG. 15 and the distance ri of FIGS. 13 and 14 in as much as the following applies: $r_i^2 = r^2 \sin \alpha/2$.

It will be understood from what has been stated above that it is the sign of $\Delta E^{III} - \Delta E^I$ which is important for determining the angle α/2. Now, as specified above, cte2 is a positive constant, only the terms of the parentheses make it possible to modify the sign.

Figure 17:
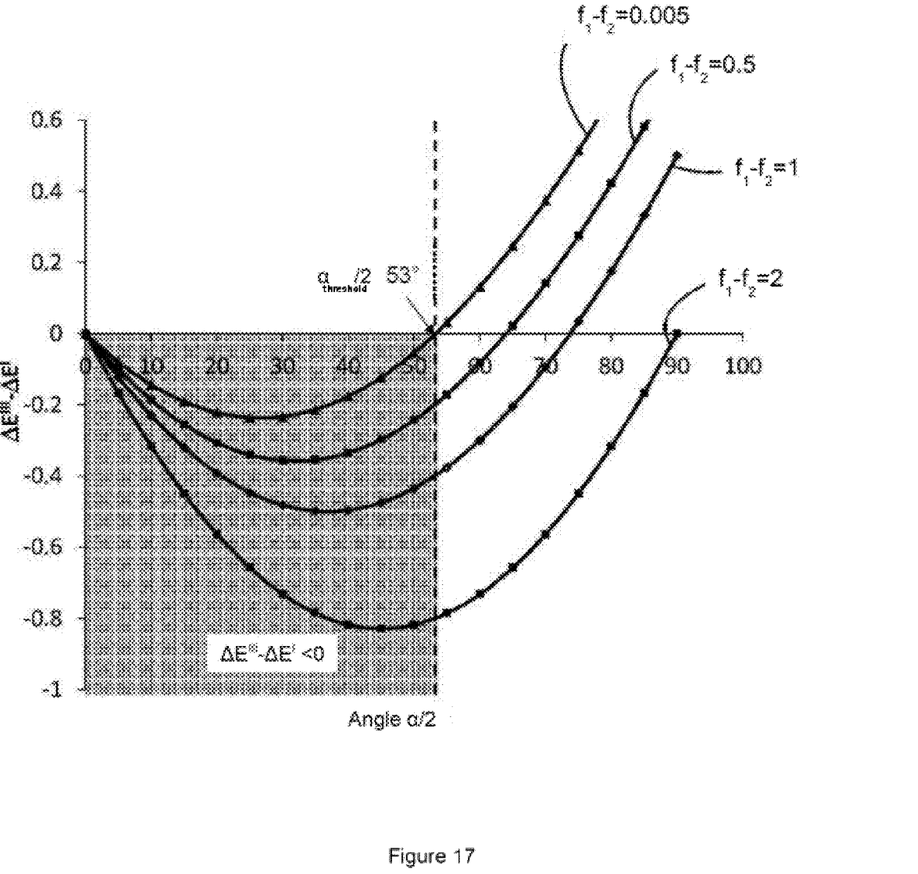

In FIG. 17, identical to FIG. 16, a dotted straight line is plotted making it possible to identify that, below $\alpha_{threshold}$ equal to 106 degrees, the value $\Delta E^{III} - \Delta E^I$ is always negative. In fact, whatever the value of the wettability factors, notably of the GaN, on the nucleation layer (f1) or on the mask (f2), and therefore whatever the value of the difference f1−f2, there is a threshold value $\alpha_{threshold}$ of the angle α below which it is certain that $\Delta E^{III} - \Delta E^I$ is negative and therefore that the nucleation of the seed will be promoted on said nucleation layer 3. In this respect, it is possible to generalize by specifying that the germination hollow 7 having a generally cone of revolution form, the angle of the generating straight line d1 of the cone of revolution relative to the axis of rotation A1 of said generating straight line is less than 53 degrees.

In other words, the step of formation of the nucleation surface 3 is such that the germination hollow 7 has a generally cone of revolution form, the angle of the generating straight line of the cone of revolution relative to the axis of rotation of said generating straight line being less than 53 degrees. Alternatively, the germination hollow 7 adopts, notably wholly or partly, the form of a cone, notably of revolution or pyramidal, the surface of which is defined by a generating straight line passing through a fixed point belonging to a main axis that is secant, notably at right angles, to the plane including a directing curve of said cone, the maximum angle α/2 between the generating straight line d1 and the main axis being less than 53 degrees.

According to another formulation, it is considered that the formation of the seed 4 is promoted when all of the points delimiting the surface of the germination hollow 7 lie within a predetermined volume. In the present case, this volume corresponds to a cone of revolution of which the angle between the generating straight line d1 and the axis of rotation A1 of said generating straight line is less than 53 degrees.

The value of 53 degrees advantageously makes it possible to guarantee that there will be a vertical growth whatever the wettability. In this respect, the notion of maximum angle is preferred but not essential.

Generally, the cone of revolution comprises a radius dependent on the angle α/2 and on the reference distance r.

A method for growing an elongate element has been described above. Obviously, this method is not limited to the growth of a single elongate element. In this respect, it is possible to produce the growth, notably simultaneous, of a plurality of distinct elongate elements from a plurality of distinct growth sites, in particular each delimited by a same mask. In other words, all that has been stated above can be applied in the context of a method for growing a plurality of elongate elements comprising the following steps:
- a formation of a plurality of nucleation surfaces each delimited at least partly by a mask, each nucleation surface comprising at least one germination hollow situated at a distance from the mask,
- a nucleation of a seed, on each nucleation surface, intended to participate in the growth of said corresponding elongate element on said at least one germination hollow of said corresponding nucleation surface,
- a growth, of a corresponding elongate element from each nucleation surface.

Furthermore, the method for growing one, or more, elongate element(s) as described above can be used in the context of a method for fabricating an electronic device, notably optoelectronic. In other words, the method for fabricating the electronic device, notably optoelectronic, can comprise a step of implementation of the method for growing an elongate element 5 and a step of functionalization of said elongate element 5 so that the latter participates in the emission, or in the reception, of photons (thus forming either a light-emitting diode, or a solar cell).

The functionalization step can comprise a step of formation of a light detecting or emitting member comprising a junction provided with a first doped member of a first type and a second doped member of a second type distinct from the first type, said first member being formed by said elongate element. The first and second types will be chosen from a doping of n type or a doping of p type.

It will be understood from what has been stated above that the invention can also relate to a substrate functionalized for the growth of an elongate element 5, notably a wire of nanowire or microwire type, this substrate comprises a nucleation surface 3 for a seed 4 making it possible to grow the elongate element, a mask 2 at least partly (even wholly) delimiting said nucleation surface. Said nucleation surface 3 comprises at least one germination hollow 7 situated at a distance from the mask 2. The germination hollow can be filled with a corresponding seed configured so as to allow the growth of said elongate element. Preferably, the germination hollow 7 is shaped according to one of the manners described above.

This functionalized substrate is then advantageously used in the context of the growth method for performing the step of nucleation of the seed 4 and the step of growth of the elongate element 5. In other words, in the context of the growth method targeted above, the step of formation of the nucleation surface 3 (and potentially of nucleation of the seed) implements a step of formation of the functionalized substrate as described above.

Figure 18:
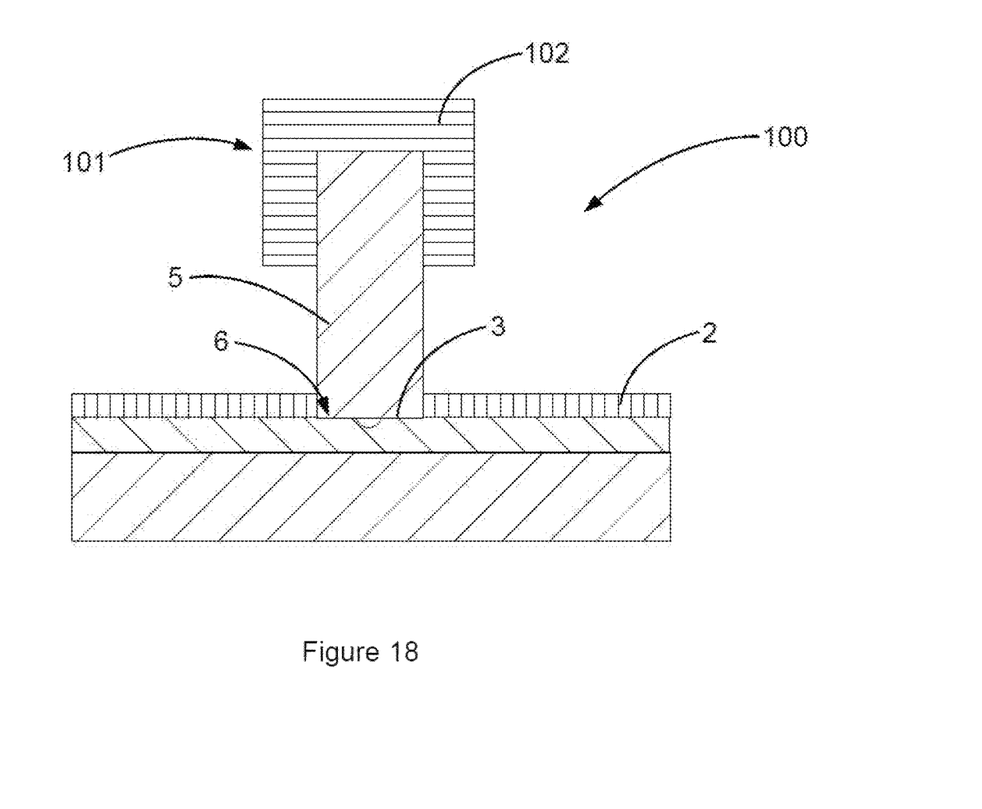
FIG. 18 illustrates, by a cross-sectional view, an optoelectronic device suitable for emitting, or receiving, photons.

As illustrated in FIG. 18, it will be understood that the invention also relates to an electronic device 100, notably optoelectronic, comprising an elongate element 5 extending from a nucleation surface 3, notably delimited at least partly by a mask 2. At least one germination hollow 7 belonging to the nucleation surface 3 is filled with the material of the elongate element 5.

The device can comprise a photon emitting or receiving member 101, said member 101 comprising a P-N junction of which a part is formed by said elongate element 5. The elongate element is then doped of a P or N type. The other part of the P-N junction can be formed by another element 102 doped in an opposite way to the elongate element 5, said other doped element 102 covering a part of the elongate element, for example in the manner of a sheath as in FIG. 18.

The invention is not limited to the nucleation of a GaN seed on a nucleation layer of TaN, it can be applied to all the materials of nucleation layers CN (TiN, VN, CrN, ZrN, NbN, MoN, HfN, TaN) and to AlN since there can be heteroepitaxy of GaN on one of these materials. In this case, the parameter "f1" which represents the wettability factor of GaN on the nucleation layer or of AlN always lies between 0 and 1 and the model remains true.

With regard to the dimensions of the germination hollows, they can be extremely small, of the order of a few nanometers (depth/width between 1 and 10 nm) since only the germination phase is considered here.

Regarding the approach by energy variation using $\Delta E^I$, $\Delta E^{II}$, $\Delta E^{III}$, the energy calculation of the associated structure is within the scope of those skilled in the art. Notably, the principles of an approach by energy variation according to the invention can be derived from the book entitled "Thermodynamique des matériaux: équilibres de phases et métastabilité" ("Material thermodynamics: phase equilibriums and metastability") by Pierre Desré and Fiqiri Hodaj, EDP Sciences—chapter 9, paragraphs 6-7.

The invention claimed is:

1. A method for growing an elongate element, comprising:
   forming a nucleation surface having at least one germination site adopting the form of at least one germination hollow and delimited at least partly by a mask, the at least one germination hollow being situated at a distance from the mask,
   performing nucleation of a seed intended to participate in the growth of the elongate element on the at least one germination hollow,
   growing the elongate element from the seed so that the elongate element extends away from the nucleation surface,
   wherein the forming of the nucleation surface comprises forming the mask on a nucleation layer, wherein an opening of the mask forms, with a part of the nucleation layer, a blind hole, wherein a bottom of the blind hole formed by the part of the nucleation layer corresponds to the nucleation surface.

2. The method as claimed in claim 1, comprising performing in succession: (i) in the formation of the nucleation surface, a modification of a topology of the nucleation layer so as to form the at least one germination hollow, (ii) the formation of the mask, (iii) the nucleation of the seed, and (iv) the growth of the elongate element.

3. The method as claimed in claim 1, further comprising supplying a substrate on which is formed a nucleation layer, wherein the formation of the nucleation surface comprises:
   etching the nucleation layer to the substrate so as to form a block,
   forming the mask on the substrate, the mask surrounding the block.

4. The method as claimed in claim 3, comprising performing, in succession: (i) in the formation of the nucleation surface, a modification of a topology of the nucleation layer so as to form the at least one germination hollow, (ii) the etching of the nucleation layer, (iii) the formation of the mask, (iv) the nucleation of the seed, and (v) the growth of the elongate element.

5. The method as claimed in claim 1, further comprising forming the at least one germination hollow so that the at least one germination hollow defines a seed nucleation zone exhibiting a variation of energy necessary for the formation of the seed, in the only nucleation zone, less than the variation of energy that would be necessary for the formation of an identical seed at a corner between the mask and the nucleation surface.

6. The method as claimed in claim 1, wherein the formation of the nucleation surface comprises determining a form of the at least one germination hollow taking into account a first wettability factor of a material intended to form the seed on a material used to form the nucleation surface and a second wettability factor of the material intended to form the seed on a material used to form the mask, and forming the at least one germination hollow according to the determined form.

7. The method as claimed in claim 6, wherein the germination hollow adopts, wholly or partly, the form of a cone, wherein a surface of the cone is defined by a generating straight line passing through a fixed point belonging to a main axis that is secant to a plane including a directing curve of the cone, and wherein the method comprises determining an angle α/2 between the generating straight line and the main axis, the angle α/2 being determined from the first and second wettability factors.

8. The method as claimed in claim 7, wherein the determination of $$\Delta E^{III} - \Delta E^{I} = cte2 * \left[ -\frac{1}{2}(f1 - f2)\sin\frac{\alpha}{2} + 2*\left(1 - \cos\frac{\alpha}{2} - \frac{1}{2}\sin\frac{\alpha}{2}\right) \right]$$

the angle α/2 comprises solving the following equation for which the result $\Delta E^{III} - \Delta E^{I}$ must be less than or equal to 0, with cte2 greater than 0, f1 the first wettability factor so that 0≤f1≤1, f2 the second wettability factor so that −1≤f2≤0.

9. The method as claimed in claim 1, wherein the formation of the nucleation surface is so that the at least one germination hollow adopts, wholly or partly, the form of a cone, wherein a surface of the cone is defined by a generating straight line passing through a fixed point belonging to a main axis that is secant to a plane including a directing curve of the cone, a maximum angle α/2 between the generating straight line and the main axis being less than 53 degrees.

10. A method for fabricating an electronic device comprising implementing the method for growing an elongate element as claimed in claim 1, and functionalizing the elongate element so that the elongate element participates in emission, or in reception, of photons.

11. A substrate functionalized for the growth of an elongate element,
the substrate comprising a nucleation surface making it possible to grow an elongate element and a mask at least partly delimiting the nucleation surface,
wherein the nucleation surface comprises at least one germination hollow situated at a distance from the mask,
wherein the nucleation surface comprising the germination hollow is adapted for growing the elongate element from a seed so that the elongate element extends away from the nucleation surface,
wherein an opening of the mask forms, with a part of the nucleation layer, a blind hole, wherein a bottom of the blind hole formed by the part of the nucleation layer corresponds to the nucleation surface.

12. The substrate as claimed in claim 11, wherein the at least one germination hollow adopts the form of a cone, wherein all or part of a surface of the cone is defined by a generating straight line passing through a fixed point belonging to a main axis that is secant to a plane including a directing curve of the cone, the maximum angle α/2 between the generating straight line and the main axis being less than 53 degrees.

13. The method as claimed in claim 1, wherein the elongate element is a nanowire.

14. The method as claimed in claim 1, wherein the elongate element is a microwire.

15. The method as claimed in claim 3, wherein the mask formed on the substrate surrounds the block at a base of the block arranged at a corner formed by the block and the substrate.

16. The method as claimed in claim 7, wherein the cone is a cone of revolution or pyramidal, the main axis is secant at right angles to the plane including the directing curve of the cone, and the method comprises determining the maximum angle α/2.

17. The method as claimed in claim 9, wherein the cone is a cone of revolution or pyramidal, and the main axis is secant at right angles to the plane including a directing curve of the cone.

18. The method as claimed in claim 1, wherein the elongate element extends substantially perpendicular to the nucleation surface.

* * * * *

UNITED STATES PATENT AND TRADEMARK OFFICE
CERTIFICATE OF CORRECTION

PATENT NO. : 10,781,534 B2
APPLICATION NO. : 15/128815
DATED : September 22, 2020
INVENTOR(S) : Bérangère Hyot It is certified that error appears in the above-identified patent and that said Letters Patent is hereby corrected as shown below:

In the Claims

In Claim 8, Column 13, Lines 25-27:
Change:
" $\Delta E^{III} - \Delta E^{I} = cte2 * \left[ -\frac{1}{2}(f1-f2)\sin\frac{\alpha}{2} + 2 * \left( 1-\cos\frac{\alpha}{2} - \frac{1}{2}\sin\frac{\alpha}{2} \right) \right]$
the angle α/2 comprises solving the following equation"
To:
-- the angle α/2 comprises solving the following equation
$\Delta E^{III} - \Delta E^{I} = cte2 * \left[ -\frac{1}{2}(f1-f2)\sin\frac{\alpha}{2} + 2 * \left( 1-\cos\frac{\alpha}{2} - \frac{1}{2}\sin\frac{\alpha}{2} \right) \right]$ --

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*